(12) United States Patent
Guo et al.

(10) Patent No.: US 6,518,176 B2
(45) Date of Patent: *Feb. 11, 2003

(54) METHOD OF SELECTIVE FORMATION OF A BARRIER LAYER FOR A CONTACT LEVEL VIA

(76) Inventors: Ted Guo, 1079 A Tanland Dr., Palo Alto, CA (US) 94303; Liang-Yuh Chen, 1400 Melbourne St., Foster City, CA (US) 94404; Suchitra Subrahmanyan, 988 Alpine Ter. #4, Sunnyvale, CA (US) 94086; Roderick C. Mosely, 4337 Diavila Ave., Pleasanton, CA (US) 94588

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,747

(22) Filed: Jun. 5, 1998

(65) Prior Publication Data

US 2001/0001503 A1 May 24, 2001

(51) Int. Cl.⁷ .............................................. H01L 21/44
(52) U.S. Cl. ..................... 438/653; 438/627; 438/630; 438/637; 438/643; 438/649; 438/664; 438/682
(58) Field of Search ........................ 438/625, 627–630, 438/637, 641–644, 649, 652–654, 660, 663, 664, 672, 682; 257/751, 752, 753, 763, 786, 769, 767, 770, 794

(56) References Cited

U.S. PATENT DOCUMENTS

| 3,616,380 A | * | 10/1971 | Lepselter et al. ............ 204/164 |
| 4,526,665 A | * | 7/1985 | Tanielian et al. ............ 204/192 |
| 4,551,907 A | | 11/1985 | Mukai .......................... 29/571 |
| 4,619,038 A | | 10/1986 | Pintchovski ................. 29/590 |
| 4,908,334 A | | 3/1990 | Zuhr et al. ................... 437/200 |
| 5,084,417 A | | 1/1992 | Joshi et al. .................. 437/192 |
| 5,240,739 A | | 8/1993 | Doan et al. ............... 427/126.1 |
| 5,312,774 A | | 5/1994 | Nakamura et al. .......... 437/192 |
| 5,378,660 A | | 1/1995 | Ngan et al. .................. 437/247 |
| 5,418,188 A | | 5/1995 | Harper et al. ................ 437/200 |
| 5,504,043 A | * | 4/1996 | Ngan et al. .................. 438/655 |
| 5,545,582 A | * | 8/1996 | Iacoponi ...................... 438/655 |
| 5,625,231 A | * | 4/1997 | Huang et al. ................ 257/751 |
| 5,723,382 A | * | 3/1998 | Sandhu et al. ............... 438/653 |
| 5,877,087 A | * | 3/1999 | Mosely et al. ............... 438/656 |
| 5,885,896 A | * | 3/1999 | Thakur et al. ............... 438/649 |
| 5,897,373 A | * | 4/1999 | Peng et al. ................... 438/653 |
| 5,912,508 A | * | 6/1999 | Iacoponi ...................... 257/770 |
| 5,956,608 A | * | 9/1999 | Khurana et al. ............. 438/627 |
| 5,989,633 A | * | 11/1999 | Hoinkis ........................ 427/250 |
| 6,008,124 A | * | 12/1999 | Sekiguchi et al. ........... 438/653 |

FOREIGN PATENT DOCUMENTS

| JP | 362169412 A | | 2/1986 | ........... H01L/21/88 |
| JP | 362169412 A | * | 7/1987 | |
| JP | 09-289178 | * | 4/1997 | |
| WO | WO 96/42105 | | 12/1996 | ......... H01L/21/285 |

* cited by examiner

*Primary Examiner*—Carl Whitehead, Jr.
*Assistant Examiner*—Khanh Duong
(74) *Attorney, Agent, or Firm*—Moser, Patterson & Sheridan LLP

(57) ABSTRACT

A contact level via and a method of performing selective deposition of a barrier layer to form a contact level via for selective aluminum metallization. Specifically, the method forms a self-aligned silicide region by depositing titanium atop a structure containing a contact level via, converting the titanium in the contact regions into titanium silicide, removing the unreacted titanium, and performing nitridation of the titanium silicide to complete a barrier layer located in only the contact region of the via. Once the barrier layer is formed, the layer can be optionally fortified through oxygen stuffing to create an effective barrier layer for aluminum metallization.

23 Claims, 8 Drawing Sheets

METHOD OF SELECTIVE FORMATION OF A BARRIER LAYER FOR A CONTACT LEVEL VIA

BACKGROUND OF THE DISCLOSURE

1. Field of the Invention

The invention relates to metallization process for manufacturing integrated circuit devices. More particularly, the invention relates to a method of performing integrated metallization using selective formation of a barrier layer for interconnect structures.

2. Description of the Background Art

Sub-half micron multilevel metallization is one of the key technologies for the next generation of very large scale integration ("VLSI") for integrated circuits. The multilevel interconnections that lie at the heart of this technology require planarization of high aspect ratio apertures, including contacts, vias, lines or other features. Reliable formation of these interconnects is very important to the success of VLSI and to the continued effort to increase circuit density and quality on individual substrates and die.

Metallization, such as aluminum, when used at the contact level, requires a diffusion barrier between the aluminum and silicon. The diffusion barrier ensures that the aluminum does not diffuse into the silicon and interfere with the conductive characteristics of the structures in the silicon. Generally, the diffusion barrier is blanket deposited upon the integrated circuit structure and the aluminum is blanket deposited atop the diffusion barrier.

Additionally, to enhance performance, the barrier layer is fortified through oxygen stuffing. Such stuffing can cause the aluminum that is deposited atop the fortified barrier layer to have a rough surface and thus result in low reflectivity. High reflectivity (indicating good film morphology) is desirable to facilitate precise lithography of the metallization.

Therefore, a need exists in the art for a method of selective formation of a diffusion barrier such that aluminum is selectively deposited in a contact via.

SUMMARY OF THE INVENTION

The disadvantages associated with the prior art metallization processes are overcome by the present invention of a method of performing selective deposition of metal within a contact via. Specifically, the present invention forms a self-aligned silicide region by depositing titanium atop a structure containing contact vias, converting the titanium in the contact regions into silicide, removing the unreacted titanium, and performing nitridation of the titanium silicide to complete the formation of a barrier layer located in the contact region only. Once the barrier layer is formed, the layer can be optionally fortified through oxygen stuffing. Thereafter, the structure is metallized. Aluminum will grow upon the barrier layer such that selective growth occurs only in the vias. Metallization can also be accomplished by conventional chemical vapor deposition (CVD) of aluminum, an integrated CVD/PVD aluminum deposition process, or a conventional aluminum deposition, e.g., physical vapor deposition (PVD), followed by planarization.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1A:
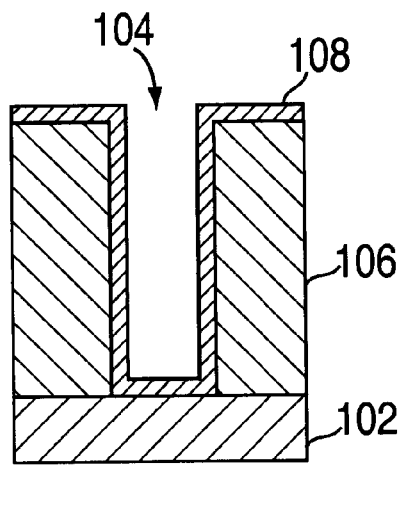
FIGS. 1A–1D depict process steps of the method of the present invention.

The present invention forms a self-aligned barrier layer within a contact region of a contact via. This barrier impedes diffusion of metal from a metallization layer into the silicon structure. The metallization can be formed using any of a number of different metallization processes that fulfill the particular application of the interconnect structure.

FIGS. 1A through 1D depict a contact level via structure as formed using a method of the present invention. FIG. 2 depicts a flow diagram representation of the method of the present invention. To best understand the invention, the reader should simultaneously refer to FIGS. 1A through 1D and FIG. 2. The invention is generally used to form a contact level interconnect structure 100 atop a silicon layer 102.

The method 200 of the invention begins at step 202 where a contact level via 104 is formed using conventional dielectric deposition and etch processes. The via 104 extends through the dielectric layer 106 (commonly known as an inter-layer dielectric (ILD)) to a silicon layer 102. The next step of the inventive process (step 204) involves performing pre-metallization cleaning of the via 104. The chemistry used to clean the via depends upon the dielectric material, e.g., a $SiO_2$ dielectric is cleaned using post etch ashing followed by a solvent rinse.

At step 206, a layer 108 of titanium is blanket deposited over the via 104. The titanium may be deposited using a conventional physical deposition (PVD) process or a conventional chemical vapor deposition (CVD) process. Preferably, to ensure sufficient step coverage the deposition is performed by a CVD process. The particular method and chemistries used to perform the CVD titanium deposition is irrelevant to the present invention. Such deposition processes are well known in the art. For example, a titanium deposition technique using $TiCl_4$ is disclosed in commonly assigned U.S. patent application Ser. No. 08/982,872, filed Dec. 2, 1997, both of these patent applications are incorporated herein by reference. The titanium is deposited to a depth of approximately 200 Å in the bottom of the contact.

Figure 1B:
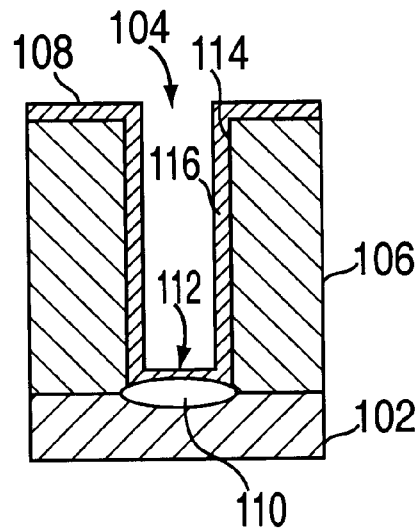
Figure 2:
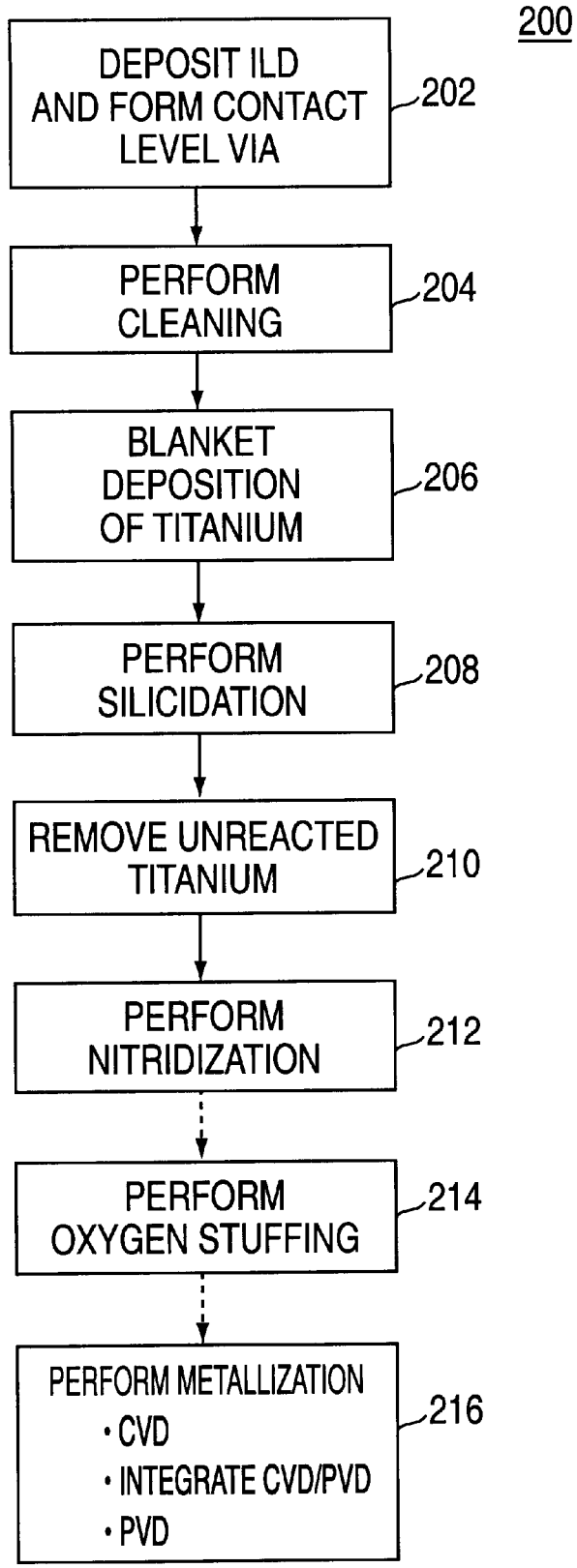
FIG. 2 depicts a flow diagram of the process of the present invention.

FIG. 1B depicts the via structure after silicidation is performed in step 208 of the inventive method. To perform silicidation of the titanium at the bottom of the via 104, preferably a rapid thermal process (RTP) is used to heat the wafer containing the titanium and silicon layers such that the silicon diffuses into the titanium to form titanium silicide at the bottom of the via, i.e., a silicide region 110. Typically, the substrate is heated to about 600 to 800 degrees C. in an ambient nitrogen environment for from 20 to 60 seconds, (preferably, 30 seconds) to facilitate silicidation to a depth of approximately 200 Å into the titanium layer.

Figure 1C:
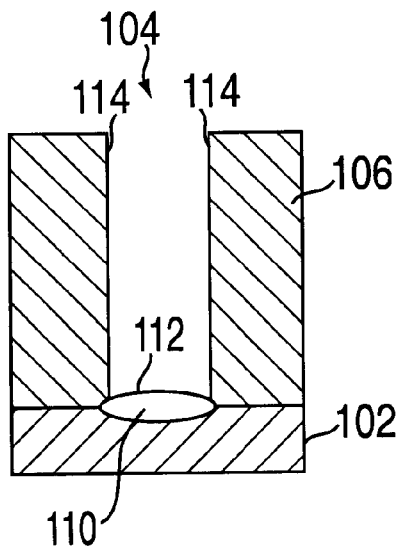

In step 210, the unreacted titanium (portion 116) is removed using, for example, a wet etch. The wet etch chemistry is preferably $H_2O_2/NH_4OH$ and is used at 55 degrees C. for 90 seconds. The result, depicted in FIG. 1C, is a via 104 having a titanium silicide region 110 at the bottom 112 of the via and having walls 114 of dielectric material. The wet etch process for removing the unreacted titanium is to be considered illustrative of one such process, any process that is capable of removing the unreacted titanium is considered to be within the scope of the invention.

In step 212, the titanium silicide is nitridized by exposing the structure to a plasma containing nitrogen, i.e., a plasma formed of a gas containing nitrogen such as molecular nitrogen ($N_2$), nitrogen/inert gas mixtures, ammonia ($NH_3$) and the like. The nitridation may also be performed using a high temperature, for example, produced in an RTP chamber, where the RTP chamber contains an atmosphere of nitrogen or ammonia. Additionally, a combination of RTP heating of the wafer and nitrogen plasma treatment may also be used to nitridize the silicide.

Figure 1D:
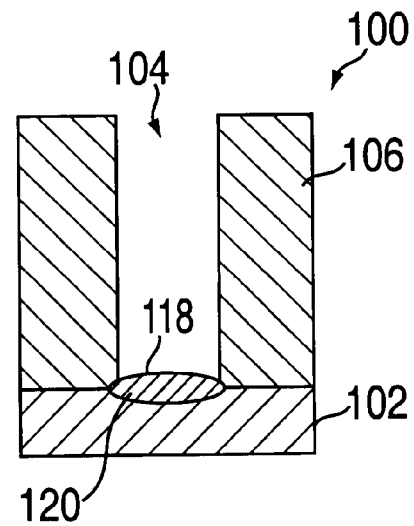

Preferably, the plasma is formed using a gas consisting of 80% helium and 20% nitrogen that is supplied to a process chamber at 5 sccm. The plasma chamber is, for example, a Preclean II chamber manufactured by Applied Materials, Inc. of Santa Clara, Calif. In this particular chamber, the plasma is formed by applying 300 watts of RF power to the chamber coil using a frequency of 400 kilohertz ("KHz") and 300 watts of substrate bias at a frequency of 13.56 megahertz ("MHz"). The process pressure is 0.4 mTorr and the process time is 90 seconds. The result of exposing the structure to the plasma, depicted in FIG. 1D, is a nitridated titanium silicide region 118. Specifically, the nitrogen forms a thin $TiSi_xN_y$ layer 118 (e.g., about 100 angstroms thick) that is sufficient barrier layer 120.

To further enhance the barrier region characteristics, at step 214, the barrier region can be optionally fortified through oxygen stuffing. Such stuffing is conventionally accomplished by exposing the structure to an oxygen plasma. The oxygen is adsorbed into the barrier region. In a practical system, the oxygen may be added to the gas used during nitridation, e.g., oxygen is added to the nitrogen atmosphere to form either an oxygen/nitrogen plasma in the PRECLEAN II chamber or an oxygen/nitrogen atmosphere in an RTP chamber. As such, the mixed gas atmosphere simultaneously nitridizes and stuffs the silicide. Generally, a 0.3 to 10 percent by volume of oxygen within the chamber atmosphere is sufficient to achieve oxygen stuffing. Oxygen stuffing can also be achieved by conventional furnace annealing in a nitrogen ambient atmosphere at 400–450° C. for 10 to 30 minutes, or by rapid thermal processing (RTP) treatment in an atmosphere of 0.3 to 10 vol. % oxygen in nitrogen, at 600° to 750° C. for 30 to 60 seconds.

Figure 6:
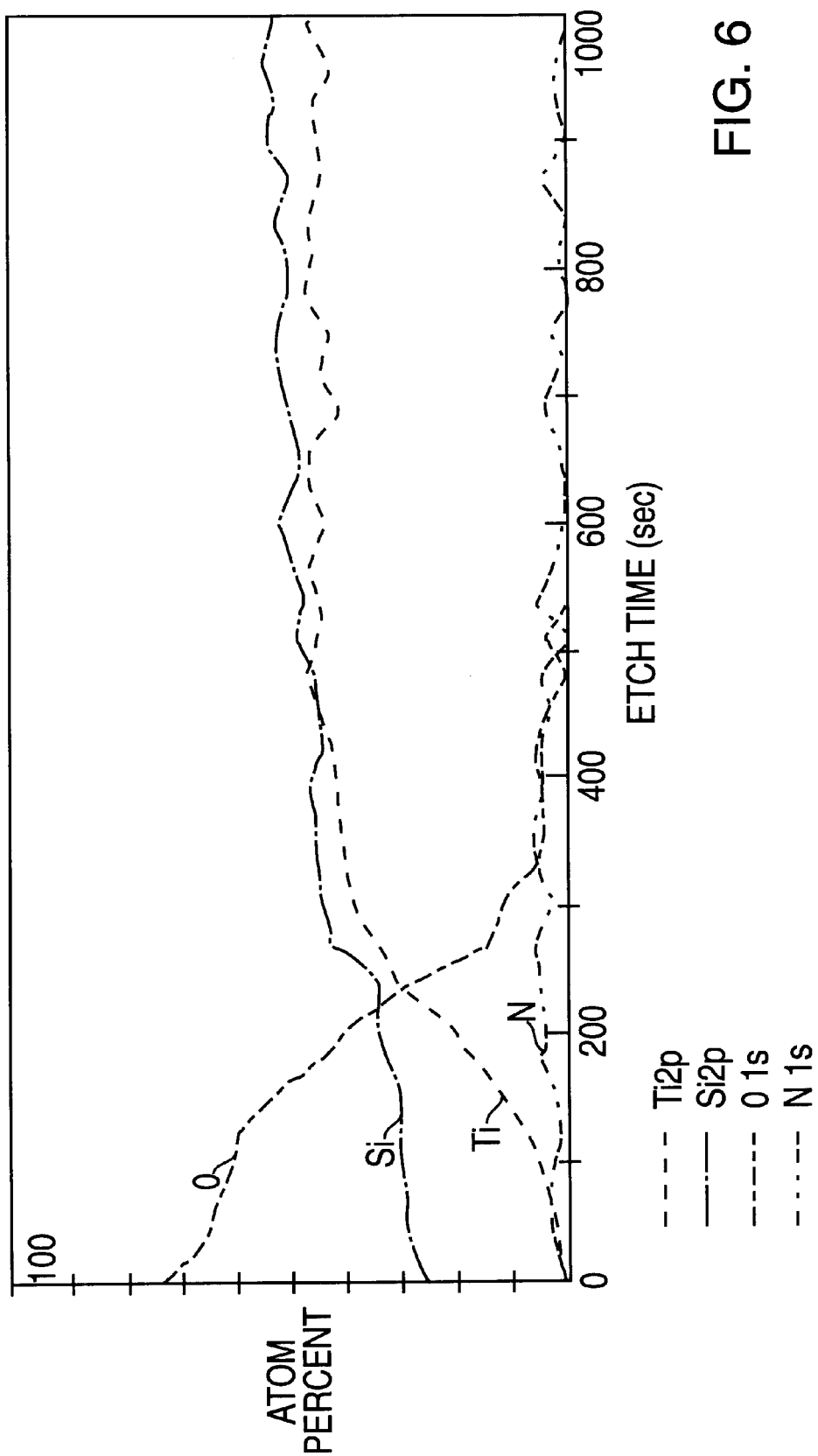
FIG. 6 depicts an XPS depth profile of the titanium silicide barrier layer without nitrogen treatment.
Figure 7:
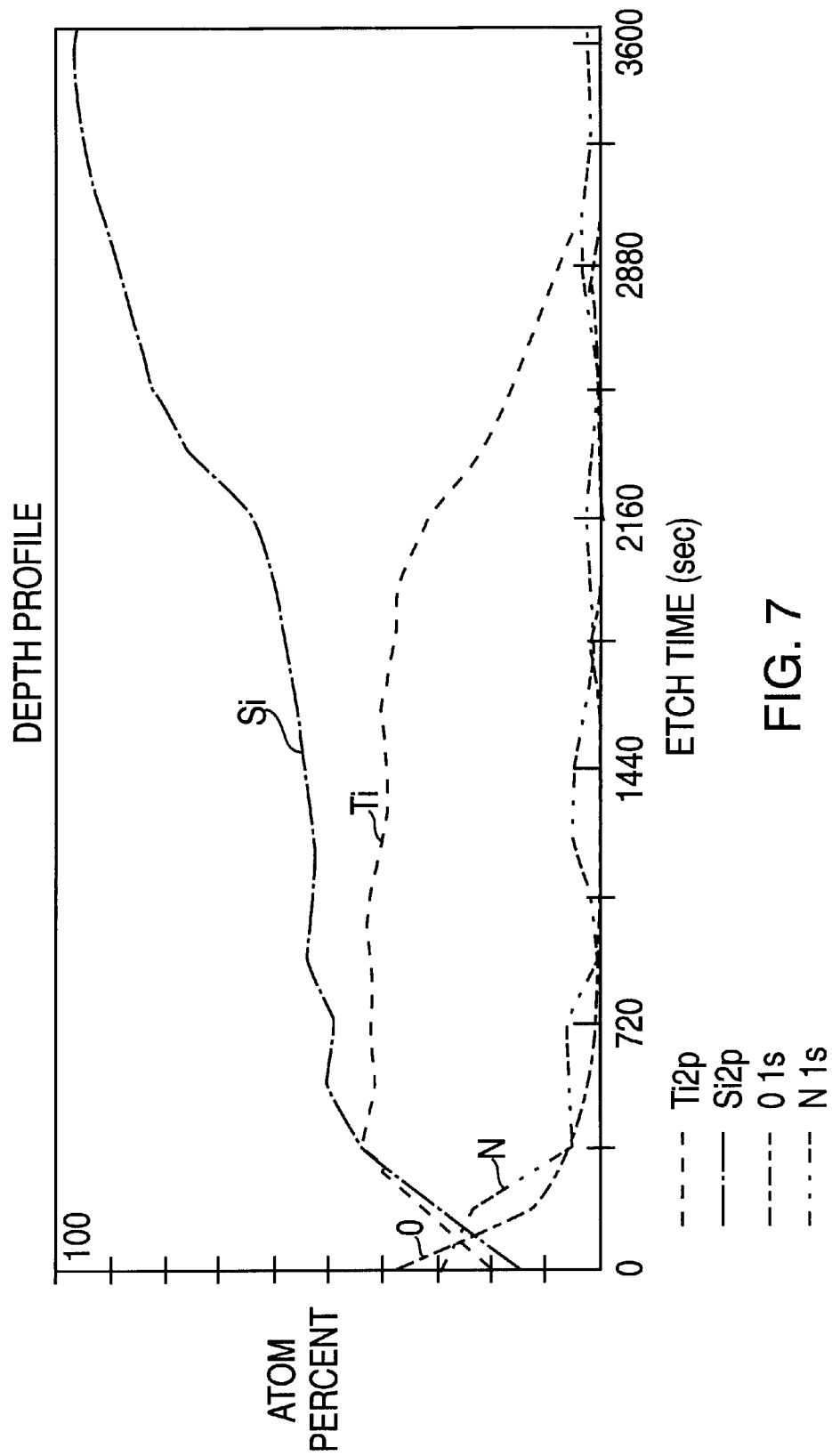
FIG. 7 depicts an XPS depth profile of a titanium silicide barrier layer with nitrogen treatment.

FIG. 6 depicts an XPS depth profile of the barrier region without nitridation and FIG. 7 depicts an XPS depth profile of the barrier region with nitridation. FIG. 6 shows a substantial amount of oxygen and very little nitrogen near the surface region. As such, the non-nitridized region is not a useful barrier layer. The nitridized region of FIG. 7 shows a substantial concentration of nitrogen, e.g., 40%, to a depth of 130 angstroms.

This barrier layer, which only resides in the bottom of the via, will block metal atoms in a metallization layer from diffusing into the silicon. At step 216 of FIG. 2, metallization, such as aluminum deposition, is performed to fill the via 104. The metallization can be accomplished by any of the many processes available for depositing metals into vias. Three such methods of metallization are described below; namely, conventional CVD (FIG. 3), integrated CVD/PVD (FIGS. 4A–4C), and PVD with planarization (FIGS. 5A–5B).

Figure 3:
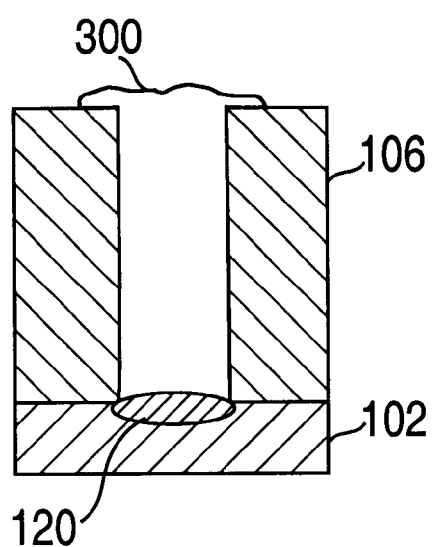
FIG. 3 depicts a contact via structure of FIG. 1D having been selectively metallized using a CVD process.

FIG. 3 depicts the contact via structure of FIG. 1D after metallization using a selective CVD aluminum deposition. A conventional CVD process deposits bulk aluminum 300 upon the diffusion barrier layer only at locations containing a conductive layer, such as a metal, i.e., only where the barrier layer 120 exists. The existence of the barrier region at the bottom of the contact via causes aluminum to deposit from the barrier region up to the dielectric surface. Thus, the CVD metallization is selective. This can be advantageous in some applications, for example, contact level via plug formation.

Figure 4A:
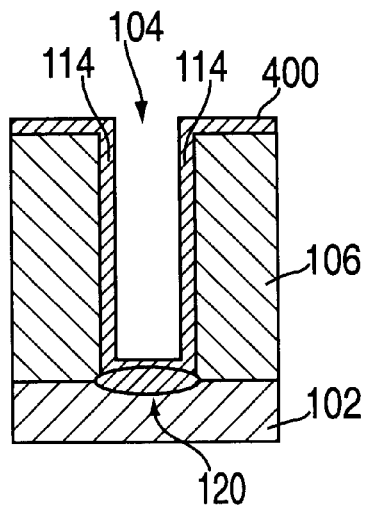
FIGS. 4A–4C depict a contact via structure of FIG. 1D as metallized using a cool aluminum process.
Figure 4B:
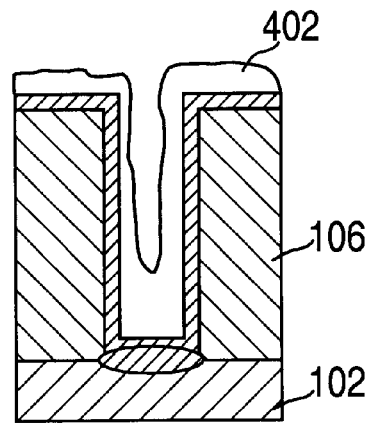
Figure 4C:
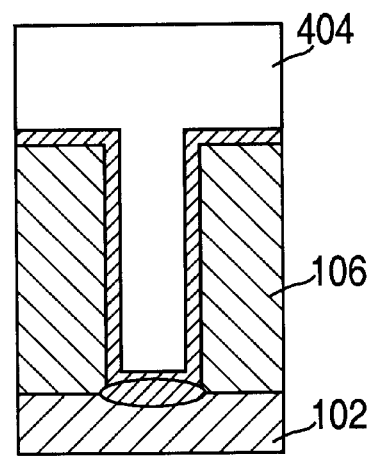
Figure 5A:
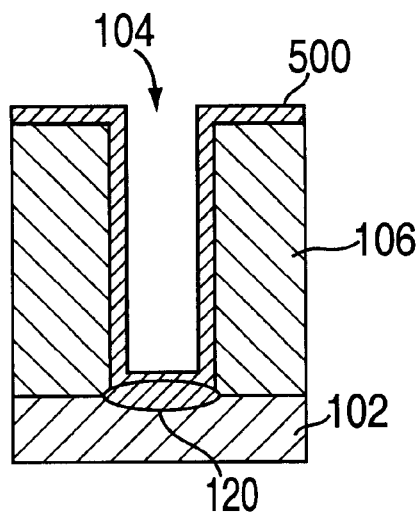
FIGS. 5A and 5B depict a contact via structure being metallized using a conventional PVD process.
Figure 5B:
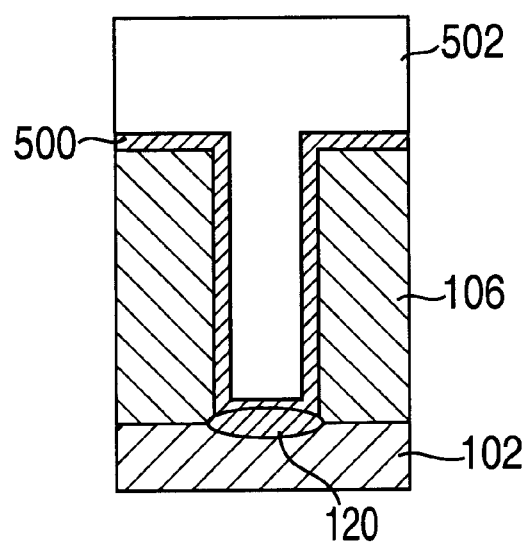

FIGS. 4A–4C depicts the contact level via as the structure is metallized using an integrated CVD/PVD aluminum process. The integrated aluminum process involves a sequence of processes steps that deposit aluminum at a low temperature, e.g., less than 400 degrees C. Such a low temperature process is disclosed in U.S. patent application Ser. No. 08/561,605 filed Nov. 21, 1995. As depicted in FIG. 4A, the process involves depositing a nucleation layer 400 using titanium or titanium/titanium-nitride. The nucleation layer may be formed using a high density plasma process and is typically 200 Å to 400 Å thick. A high density plasma process uses a PVD chamber that ionizes the deposition plasma proximate a titanium target using inductive energy coupled from a coil antenna that is driven by an RF power supply. The sputtered target material, e.g., titanium, is charged (ionized) in the inductive field such that the ionized particles propagate towards the semiconductor wafer. To promote particle propagation, the semiconductor wafer is generally floating relative to ground, or negatively biased by an external source, such that the wafer attains a self-bias voltage that attracts the charged particles. A high density plasma process produces a titanium layer having adhesion properties that make this process well suited for nucleation layer deposition.

After nucleation, a layer 402 of aluminum is blanket deposited over the nucleation layer 400 using a low temperature CVD process. The nucleation layer 400 assures that the layer 402 sufficiently adheres to the walls 114 of the via 104. An oxygen stuffed blanket barrier layer of the prior art typically causes the aluminum deposition to be rough and have poor reflectivity. In the present invention, the oxygen stuffed barrier layer is only located at the bottom of the contact level via 104 and the nucleation layer 400 is not oxygen stuffed. Therefore, the aluminum layer deposited above the self aligned/fortified barrier has a much smoother morphology and high reflectivity.

Lastly, a bulk aluminum layer 404 is deposited using a low temperature PVD process to fill the via 104. Planarization of the layer occurs by aluminum diffusion at process temperatures during the PVD process. By using the process of the present invention, the aluminum layer 404 has excellent reflectivity, e.g., greater than 180% at 435 nm versus less than 100% reflectivity using a conventional blanket deposited barrier layer. Reflectivity is a well known standard for measuring smoothness of a surface, where the reflectivity of a blank silicon wafer surface has a reference reflectivity of 100%.

Alternatively, a conventional PVD process can be used to deposit aluminum and fill the via 104. FIGS. 5A and 5B depict two steps used in depositing a PVD aluminum layer. The first step forms a "wetting" layer 500 of titanium, titanium/titanium-nitride, or titanium-nitride, atop the via structure to conformally coat the walls 114 and bottom 112 of the via 104. Preferably, the wetting layer is deposited using an IMP deposition technique. Following the wetting layer 500, a bulk aluminum layer 502 is deposited using PVD. The aluminum layer is planarized through aluminum diffusion during the PVD process.

Using the process of the present invention, where the barrier layer is selectively formed only at the bottom of the via, the morphology of the metallization layer is decoupled from the morphology of the barrier layer. In the prior art, both the barrier and the metallization layers are blanket deposited such that the morphology of the barrier layer will substantially appear as the morphology of the metallization layer. Consequently, the roughness caused by oxygen stuffing and other characteristics of a blanket deposited barrier layer reduce the reflectivity of the metallization layer. The present invention, by selectively locating the barrier layer at the bottom of the contact level via, substantially improves the reflectivity of the metallization layer.

Figure 8:
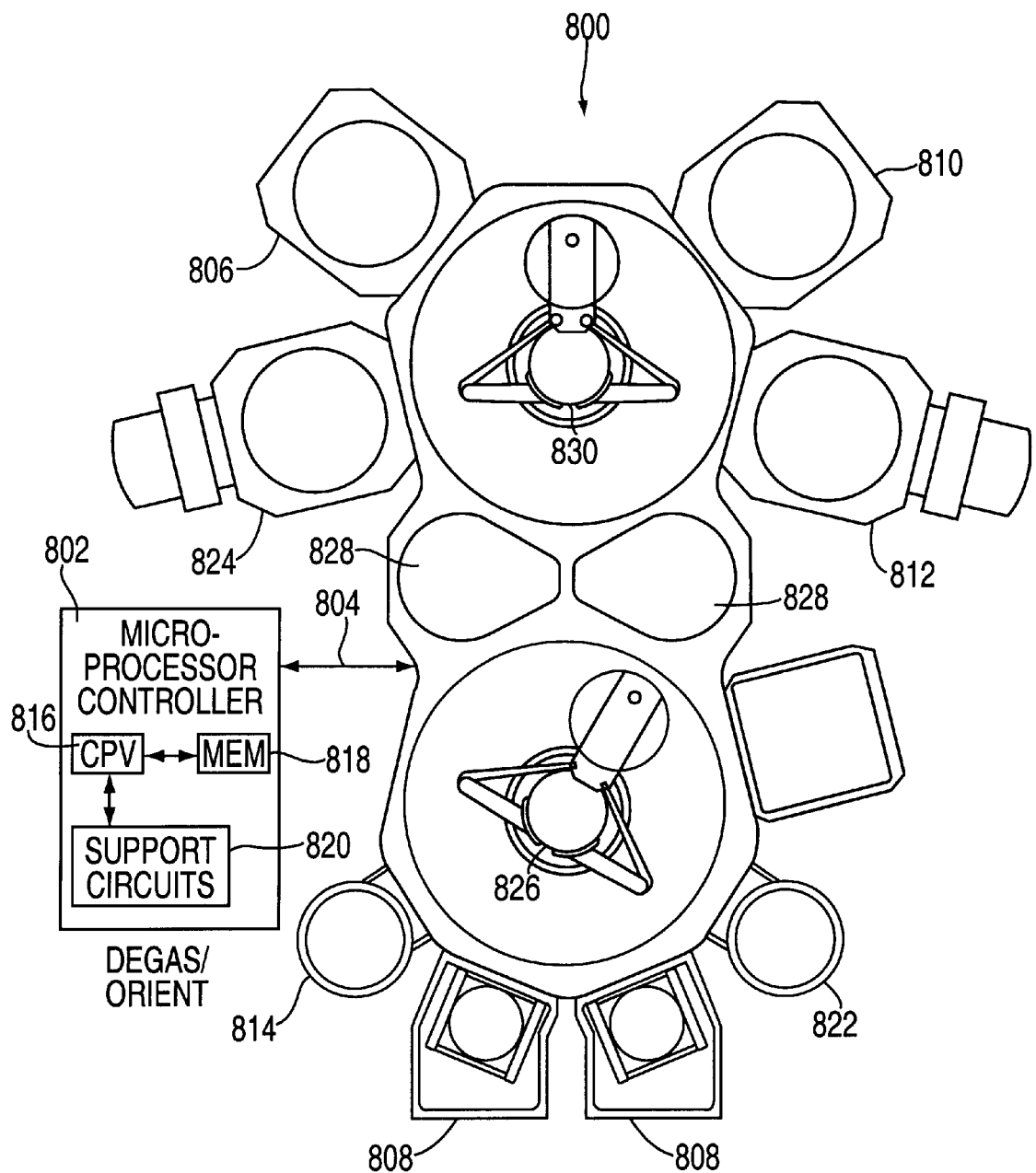
FIG. 8 depicts a schematic diagram of an integrated cluster tool suitable for processing semiconductor substrates.

The process steps 204, 208, 212, and 216 depicted in FIG. 2 can be implemented as a software routine or routines executed by a computer system controlling one or more process reactors. FIG. 8 depicts a schematic diagram of an integrated cluster tool 800 typically used in processing semiconductor substrates (or wafers). One such staged-vacuum substrate processing system 800 is disclosed in U.S. Pat. No. 5,186,718, issued Feb. 16, 1993, which is hereby incorporated herein by reference. The illustrative system 800 (known as a cluster tool) comprises an arrangement of process chambers 806, 810, 812, 824 coupled to a microprocessor controller 802. The cluster tool generally includes at least one loadlock chamber 808, a de-gas/orienter chamber 814, a pre-clean chamber 822, an etching chamber 824, a titanium deposition chamber 806, a nitrogen plasma chamber 810, a metallization chamber 812, and other processing chambers depending upon the particular application. An RTP chamber and any wet etch equipment are generally not coupled to the cluster tool. As such, the wafers are moved from the cluster tool to the RTP chamber or wet etch equipment via the load lock chamber 808.

The controller 802 contains a central processing unit 816, memory 818 (e.g., RAM, ROM, removable storage, hard disk and the like), and conventional support circuits 820 (e.g., cache, I/O circuits and peripherals, power supplies, clock circuits, and the like). The controller 802 is a general purpose computer that is programmed to operate as a specific purpose computer when executing the methods of the present invention. The controller 802 is coupled to the chambers and the cluster tool via a communications bus 804.

According to the present invention, the controller 802 executes programs stored in memory 818 to control the processes in each chamber of the cluster tool to perform the process of FIG. 2. Although a single controller 802 is shown coupled to multiple chambers, those skilled in the art will realize that the inventive process may be distributed and have portions thereof executed by multiple, independent controllers, e.g., one controller for each reactor or chamber. For example, all the process steps can be accomplished within the cluster tool unless the process uses RTP processing and/or a wet etch process. For these process steps, separate equipment is generally utilized.

More specifically, a substrate is loaded into the processing system 800 through the loadlock chamber 808 and transferred by a robot 826 to the de-gas/orienter chamber 814. Once the substrate is degassed and oriented, the substrate is moved by the robot 826 into an intermediate staging chamber 828. The substrate is then transferred by a second robot 830 into the various process chambers 806, 810, 812, and 824 such that the method of the present invention is accomplished as described above with respect to FIG. 2. Once processing is completed, the substrate is returned by the robots 826 and 830 to a loadlock 808.

Although various embodiments which incorporate the teachings of the present invention have been shown and described in detail herein, those skilled in the art can readily devise many other varied embodiments that still incorporate these teachings.

What is claimed is:

1. A method of selectively forming a barrier region in a contact level via, comprising the steps of:

providing a substrate having a silicon layer and a dielectric layer, where a via is formed through the dielectric layer and has a bottom exposing at least a portion of the silicon layer;

depositing a layer of titanium;

processing said titanium to form titanium silicide at said bottom of said via;

removing said titanium and leaving said titanium silicide; and treating said titanium silicide at said bottom of said via with a nitrogen/oxygen plasma, wherein said oxygen is present in an amount between about 1.5–10 volume %, and where said treated titanium silicide is said barrier region.

2. The method of claim 1 wherein said processing step is accomplished using rapid thermal processing.

3. The method of claim 1 wherein said processing step further comprises the step of:

heating said substrate to a temperature of between 600 and 800 degrees C. for a period of approximately 30 seconds.

4. The method of claim 1 wherein said layer of titanium is approximately 200 Å thick.

5. The method of claim 1 wherein said removing step is accomplished using a wet etchant.

6. The method of claim 1 further comprising the step of metallizing said via to contact said treated titanium silicide.

7. The method of claim 6 wherein said metallizing step includes depositing aluminum using a deposition process selected from the following: a chemical vapor deposition process, a physical vapor deposition process, or an integrated chemical vapor deposition/physical vapor deposition process.

8. A contact level via formed using a method comprising the steps of:

providing a substrate having a silicon layer and a dielectric layer, where a via is formed through the dielectric layer and has a bottom exposing at least a portion of the silicon layer;

depositing a layer of titanium;

processing said titanium to form titanium silicide at said bottom of said via;

removing said titanium and leaving said titanium silicide; and treating said titanium silicide at said bottom of said via with a nitrogen/oxygen plasma, wherein said oxygen is present in an amount between about 1.5–10 volume %, and where said treated titanium silicide is said barrier region.

9. The contact level via of claim 8 wherein said processing step is accomplished using rapid thermal processing.

10. The contact level via of claim 8 wherein said processing step further comprises the step of:
heating said substrate to a temperature of between 600 and 800 degrees C. for a period of approximately 30 seconds.

11. The contact level via of claim 8 wherein said layer of titanium is approximately 200 Å thick.

12. The contact level via of claim 8 wherein said removing step is accomplished using a wet etchant.

13. The contact level via of claim 8 further comprising a step of metallizing said via to contact said treated titanium silicide.

14. The method of claim 8 further comprising the step of metallizing said barrier region.

15. The method of claim 14 wherein said metallizing step includes depositing aluminum using a deposition process selected from the following: a chemical vapor deposition process, a physical vapor deposition process, or an integrated chemical vapor deposition/physical vapor deposition process.

16. A computer system having a memory coupled to a processor, where execution by said processor of a program stored in said memory causes said computer system to control a semiconductor wafer processing system to perform a method of selectively forming a barrier region in a contact level via comprising the steps of:
providing a substrate having a silicon layer and a dielectric layer, where a via is formed through the dielectric layer and has a bottom contacting the silicon layer;
depositing a layer of titanium;
processing said titanium to form titanium silicide at said bottom of said via;
removing said titanium and leaving said titanium silicide; and
treating said titanium silicide at said bottom of said via with a nitrogen/oxygen plasma, wherein said oxygen is present in an amount between about 1.5–10 volume %, and where said treated titanium silicide is said barrier region.

17. The program of claim 16 wherein said processing step is accomplished using rapid thermal processing.

18. The program of claim 16 wherein said processing step further comprises the step of:
heating said substrate to a temperature of between 600 and 800 degrees C. for a period of approximately 30 seconds.

19. The program of claim 16 wherein said layer of titanium is approximately 200 Å thick.

20. The program of claim 16 wherein said removing step is accomplished using a wet etchant.

21. The program of claim 16 further comprising the step of metallizing said via to contact said treated titanium silicide.

22. The program of claim 16 further comprising the step of metallizing said barrier region.

23. The program of claim 22 wherein said metallizing step includes depositing aluminum using a deposition process selected from the following: a chemical vapor deposition process, a physical vapor deposition process, or an integrated chemical vapor deposition/physical vapor deposition process.

* * * * *